(12) United States Patent
Hetzler (10) Patent No.: US 10,151,779 B2
(45) Date of Patent: Dec. 11, 2018

(54) MEASURING RESISTOR AND CORRESPONDING MEASURING METHOD

(71) Applicant: Isabellenhuette Heusler GmbH & Co. KG, Dillenburg (DE)

(72) Inventor: Ullrich Hetzler, Dillenburg-Oberscheld (DE)

(73) Assignee: Isabellenhuette Heusler GmbH & Co., LG, Dillenburg (DE)

( * ) Notice: Subject to any disclaimer, the term of this patent is extended or adjusted under 35 U.S.C. 154(b) by 553 days.

(21) Appl. No.: 14/779,009

(22) PCT Filed: Feb. 17, 2014

(86) PCT No.: PCT/EP2014/000430
§ 371 (c)(1),
(2) Date: Sep. 21, 2015

(87) PCT Pub. No.: WO2014/161624
PCT Pub. Date: Oct. 9, 2014

(65) Prior Publication Data
US 2016/0041206 A1    Feb. 11, 2016

(30) Foreign Application Priority Data

Apr. 5, 2013 (DE) .................. 10 2013 005 939

(51) Int. Cl.
G01R 19/00 (2006.01)
G01R 1/20 (2006.01)
G01R 35/00 (2006.01)

(52) U.S. Cl.
CPC ......... *G01R 19/0092* (2013.01); *G01R 1/203* (2013.01); *G01R 35/005* (2013.01)

(58) Field of Classification Search
CPC ... G01R 19/0092; G01R 35/005; G01R 1/203
(Continued)

(56) References Cited

U.S. PATENT DOCUMENTS 6,181,234 B1    1/2001  Szwarc et al.
7,385,828 B2 *  6/2008  Oman .................... G01R 1/203
                                                361/58
(Continued)

FOREIGN PATENT DOCUMENTS

DE        4243349 A1   6/1994
DE    102005059561 A1   6/2007
(Continued)

OTHER PUBLICATIONS

Abstract for JP2009244065 (2009).
International Search Report for PCT/EP2014/000430 dated Jul. 4, 2014.

*Primary Examiner* — Melissa Koval
*Assistant Examiner* — Trung Nguyen
(74) *Attorney, Agent, or Firm* — Caesar Rivise, PC (57) ABSTRACT

The invention relates to a measuring resistor (1), in particular a low-resistance current-measuring resistor, comprising two terminal parts (2, 3) that consist of a conductor material for introducing and discharging a current, and a resistor element (4) that consists of a resistor material, wherein the resistor element (4) is arranged between the two terminal parts (2, 3) in the direction of the current and current flows through the resistor element (4). According to one variant of the invention, the measuring resistor (1) has several pairs of voltage-measuring contacts (7) for measuring the voltage falling across the resistor element (4) in order to be able to compensate metrologically for inhomogeneities in the current density. In contrast, according to another variant of the invention, one pair of voltage-measuring contacts (7) is arranged at a location at which the measuring resistor (1) exhibits neither a capacitive behavior nor an inductive behavior, such that the current flowing through the measur- (Continued)

ing resistor (1) and the voltage across the voltage-measuring contacts (7) are substantially in phase.

20 Claims, 9 Drawing Sheets

(58) Field of Classification Search
USPC ....... 324/126, 421, 500, 525, 549, 691, 727, 324/754.28, 600, 632, 687, 76.11, 522, 324/754.26; 607/4, 5, 9, 55, 56, 57, 74, 607/34, 66, 119–123
See application file for complete search history.

(56) References Cited

U.S. PATENT DOCUMENTS

| | | |
|---|---|---|
| 9,865,532 B2 * | 1/2018 | Glenn ............... H01L 23/49589 |
| 2007/0177318 A1 | 8/2007 | Oman et al. |

FOREIGN PATENT DOCUMENTS

| | | |
|---|---|---|
| DE | 102006039722 A1 | 2/2008 |
| DE | 102012211749 A1 | 3/2013 |
| EP | 0605800 A1 | 7/1994 |
| GB | 2434252 A | 7/2007 |
| JP | 2009244065 A | 10/2009 |
| JP | 2010165810 A | 7/2010 |
| WO | 2007068409 A1 | 6/2007 |

* cited by examiner

MEASURING RESISTOR AND CORRESPONDING MEASURING METHOD

BACKGROUND OF THE INVENTION

The invention relates to a measuring resistor, in particular a low-resistance current sense resistor. The invention also relates to a corresponding measuring method.

It has been known for some years from the prior art (e.g. DE 42 43 349 A1) to use low-resistance current sense resistors ("shunts") to measure current by what is known as the four-wire technique. In this technique, the electric current to be measured is fed into the low-resistance current sense resistor, and the voltage drop across the resistor element of the low-resistance current sense resistor is measured. According to Ohm's law, the measured voltage is then a measure of the electric current flowing through the current sense resistor.

Such current sense resistors can have a planar design, such as is described in EP 0 605 800 A1 and DE 42 43 349 A1 for example. WO 2007/068409 A1 and DE 10 2005 059 561 A1, for example, describe a different design for such current sense resistors in the form of a coaxial resistor.

The measurement precision of these known current sense resistors, however, is not yet completely satisfactory.

Reference is also made to the prior art document U.S. Pat. No. 6,181,234 B1. This document discloses a planar low-value resistor having a centrally arranged resistive strip, which can be made of a nickel-aluminum alloy for instance. Two thermally conductive elements, which are likewise planar and may be made of copper, for example, and are used solely for buffering and dissipating generated heat, are welded to the two opposite side edges of the resistive strip. In this arrangement, five contact pairs are formed side by side on the top face of the thermally conductive element. One of these contact pairs is used here to measure the voltage drop across the resistive strip, whereas the other contact pairs are used for conducting in and out the electric current, which facilitates a current measurement by means of the known four-wire technique. In this case, the voltage drop across the resistor is again measured at one specific position by means of a single contact pair. It should also be mentioned in this connection that the planar thermally conductive elements at the sides of the resistive strip are not themselves used for making the electrical contact, and also are not suitable for this purpose. This known resistor thus has a fundamentally different design and is therefore not of the type in question.

Finally, reference is made to DE 10 2006 039 722 A1 and to DE 10 2012 211 749 A1 as prior art documents. These documents, however, disclose different types of resistors and are therefore likewise not of the type in question.

Therefore the object of the invention is to make appropriate improvements to the known measuring resistors.

This object is achieved by a measuring resistor and a corresponding measuring method according to the invention.

SUMMARY OF THE INVENTION

The invention is based on the technical fact known from physics that for the known current sense resistors the current density in the resistor element is not precisely homogeneous nor oriented in exactly the same direction, with the result that the voltage values measured at the measuring resistor depend on the location of the measurement i.e. on where the voltage-measuring contacts are positioned. These error-producing inhomogeneities in the current density in the resistor element are caused, for example, by an asymmetric current input, inhomogeneities in the connecting lead, connecting contact and resistive material, temperature dependencies of a copper series resistance, the skin effect and inductive and magnetic-field effects. When calculating the electric current flowing through the current sense resistor from the measured voltage value in accordance with Ohm's law, it is assumed, however, that the measured voltage value equals exactly the voltage drop across the resistor element of the current sense resistor. In fact, the aforementioned inhomogeneities introduce errors into the calculation of the electric current flowing through the current sense resistor.

Therefore the invention includes the general technical teaching of taking account of the inhomogeneities in the current density in the measuring resistor to allow a more precise measurement.

The resistor according to the invention, like the conventional current sense resistor described in the introduction, preferably comprises two connection parts made of an electrically conductive conducting material in order to conduct the electric current into and out of the resistor.

The conducting material of the two connection parts is preferably copper or a copper alloy, because this material has an extremely low resistivity. The invention is not limited to copper or copper alloys for the conducting material of the connection parts, however, but in principle can also be implemented using other conducting materials that have a sufficiently low resistivity. The resistivity of the conducting material is preferably less than $10^{-5}$ Ω·m, $10^{-6}$ Ω·m or even less than $10^{-7}$ Ω·m.

In addition, the resistor according to the invention, in common with the conventional current sense resistor described in the introduction, comprises a resistor element that is arranged in the current path between the two connection parts so that the electric current flows through the resistor element. The resistor element here is made of a low-resistance resistive material with a resistivity greater than the resistivity of the conductive material of the two connection parts. For instance the resistive material of the resistor element may be a nickel alloy such as nickel chromium or copper nickel, for example. Preferably, however, Cu84Ni4Mn12 (Manganin®) or Cu91Mn7Sn2 (Zeranin® 30) is used as the resistive material.

It must be mentioned here that the resistive material preferably has a low resistance and has a resistivity that is less than $10^{-4}$ Ω·m, $10^{-5}$ Ω·m or even less than $10^{-6}$ Ω·m.

It must also be mentioned that the connection parts and/or the resistor element are preferably planar in design, which also includes a design in the form of a bent plate, such designs being known per se, however, in the prior art.

In a preferred exemplary embodiment of the invention, the measuring resistor does not comprise just a single pair of voltage-measuring contacts connected to the connection parts of the measuring resistor in order to measure the voltage drop across the resistor element of the measuring resistor.

Instead, the measuring resistor according to the invention preferably comprises a plurality of pairs of voltage-measuring contacts, wherein one voltage-measuring contact of each pair is connected to the one connection part whereas the other voltage-measuring contact of each pair is connected to the other connection part. Each pair of voltage-measuring contacts thus measures the voltage drop across the resistor element of the measuring resistor at different spatial positions in the measuring resistor. It is hence possible to use measurements to correct for the error-producing inhomogeneities in the current density described in the introduction by calculating the voltage drop across the measuring resistor from all the voltage values measured at the pairs of voltage-measuring contacts, for example by means of a simple averaging technique.

The pairs of voltage-measuring contacts are here preferably arranged in the measuring resistor side by side with respect to the direction of current flow. For a planar measuring resistor, as is known from EP 0 605 800 A1 for instance, this means that the individual pairs of voltage-measuring contacts are arranged side by side across the measuring resistor. In contrast, for a coaxial resistor, as is known from WO 2007/068409 A1 for instance, this means that the individual pairs of voltage-measuring contacts are preferably distributed around the circumference of the coaxial resistor.

The two aforementioned documents EP 0 605 800 A1 and WO 2007/068409 A1 describe a planar measuring resistor and a coaxial resistor respectively, and so there is no need to provide a detailed description of the design features of these resistor types. The content of these documents as regards the design of a planar measuring resistor or a coaxial resistor can therefore be incorporated in full in the present description.

It must also be mentioned that the pairs of voltage-measuring contacts are preferably arranged in a substantially equidistant distribution. This is advantageous because the measured voltage values then provide a meaningful representation of the spatial current density distribution, so that it is possible to achieve good correction for the inhomogeneities in the current density distribution by means of measurements.

It must also be mentioned that the aforesaid error-producing inhomogeneities are particularly relevant when the width of the resistor element across the direction of current flow is relatively large. By virtue of correcting for the error-producing inhomogeneities, however, the measuring resistor according to the invention allows relatively large widths of more than 5 mm, 10 mm, 20 mm, 5 mm, 100 mm or even more than 200 mm.

Another point to mention is that the number of pairs of voltage-measuring contacts is preferably greater than 2, 4, 6 or even 8, where a high spatial density of pairs of voltage-measuring contacts allows good measurement-based correction for the error-producing inhomogeneities because it then allows improved modeling of the spatial variations in the current density in the measuring resistor.

It should also be mentioned that the current and voltage in the resistor element of the measuring resistor exhibit partially inductive behavior and partially conductive behavior. Capacitive behavior of current and voltage is characterized by the current leading the voltage for an alternating current. Inductive behavior, on the other hand, is characterized by the current lagging the voltage for an alternating current. For a planar current sense resistor, the current and voltage in the lateral outer-lying regions of the resistor element typically behave capacitively, whereas the current and voltage in a central region of the resistor element behave mainly inductively. Located between the capacitive regions and the inductive regions of the resistor element are neutral points, in which the current and voltage are substantially in phase and hence exhibit neither capacitive nor inductive behavior. Therefore in a variant of the invention, a pair of voltage-measuring contacts is arranged on the measuring resistor at a position that corresponds to the aforementioned neutral point. This means that the current through the measuring resistor and the voltage measured across the pair of voltage-measuring contacts are in phase. This variant of the invention also claims protection for a measuring resistor having only a single pair of voltage-measuring contacts, provided that these voltage-measuring contacts are arranged at the neutral point of the measuring resistor.

In addition, the invention also claims a complete measurement assembly comprising the measuring resistor according to the invention described above and comprising an evaluation unit, which is connected to at least one pair of voltage-measuring contacts and determines from the measured voltage value(s) the voltage drop across the resistor element in order to be able to calculate therefrom the electric current flowing through the measuring resistor in accordance with Ohm's law.

Moreover, the invention also claims protection for a corresponding measuring method, where the details of the measuring method are already apparent from the above description.

In addition, it must also be pointed out here that the individual voltage values measured at the different pairs of voltage-measuring contacts are preferably each weighted by a weighting factor in order then to be able to calculate the voltage drop across the measuring resistor from the weighted measured voltage values. Before the actual measurement, these weighting factors are preferably determined in a separate calibration process.

It must be mentioned with regard to the weighting factors that the error-producing inhomogeneities in the current profile in the resistor element can be corrected for in full by an optimum set of weighting factors. The error-producing inhomogeneities of the current profile in the measuring resistor also depend, however, on the currently valid measurement parameters (e.g. temperature, frequency, external magnetic field, etc.). An optimum set of weighting factors thus allows optimum correction for the error-producing inhomogeneities in the resistor element only for a corresponding set of measurement parameters. Thus in one exemplary embodiment of the invention, the weighting factors are not preset as a constant value for a specific component but are defined according to the currently valid measurement parameters. Thus, for instance, if the measurement is made under an external magnetic field, then other weighting factors are chosen than if the measurement is made without an external magnetic field. It is thereby possible largely to correct for the error-producing inhomogeneities of the current profile in the resistor element regardless of the external measurement conditions (e.g. temperature, frequency, magnetic field) by selecting a particular set of weighting factors that is optimum for the currently prevailing measurement conditions. The optimum set of weighting factors is in this case preferably determined in a calibration process. In the calibration process, predetermined, known currents flow through the measuring resistor, and the voltage values are measured across the voltage-measuring contacts for each current. The measurement parameters (e.g. temperature, frequency, magnetic field) are also measured for each value. An optimum set of weighting factors can thereby be determined for each operating point. The weighting factors determined in this way for the various measurement parameters can then be stored in a multidimensional characteristic array, and then simply read out during the actual measurement operation.

It is also possible as an alternative, however, not to read the optimum weighting factors from a characteristic array but to determine said factors analytically on the basis of the currently valid measurement parameters.

It should also be mentioned that the individual measured voltage values are preferably measured synchronously. This synchronous and parallel measurement of a plurality of measured voltage values also results in a sharp reduction in noise, which is a great advantage for the measured voltage values, which are usually very small, because this means that the measurement resolution can be increased.

In addition, the individual measured voltage values are preferably measured at a very high sampling rate of, for example, more than 100 Hz, 500 Hz, 1 kHz, 2 kHz or even more than 4 kHz.

In a preferred exemplary embodiment of the invention, an average value is calculated for the voltage values measured at the individual pairs of voltage-measuring contacts, which calculation can also apply different weightings to the individual measured voltage values.

This averaging can optionally be performed on the basis of the analog measured voltage values or on the basis of correspondingly digitized measured voltage values.

BRIEF DESCRIPTION OF SEVERAL VIEWS OF THE DRAWINGS

Other advantageous developments of the invention are explained in greater detail below with reference to the description of the preferred exemplary embodiments in conjunction with the figures, in which.

DETAILED DESCRIPTION OF PREFERRED EMBODIMENTS

Figure 1:
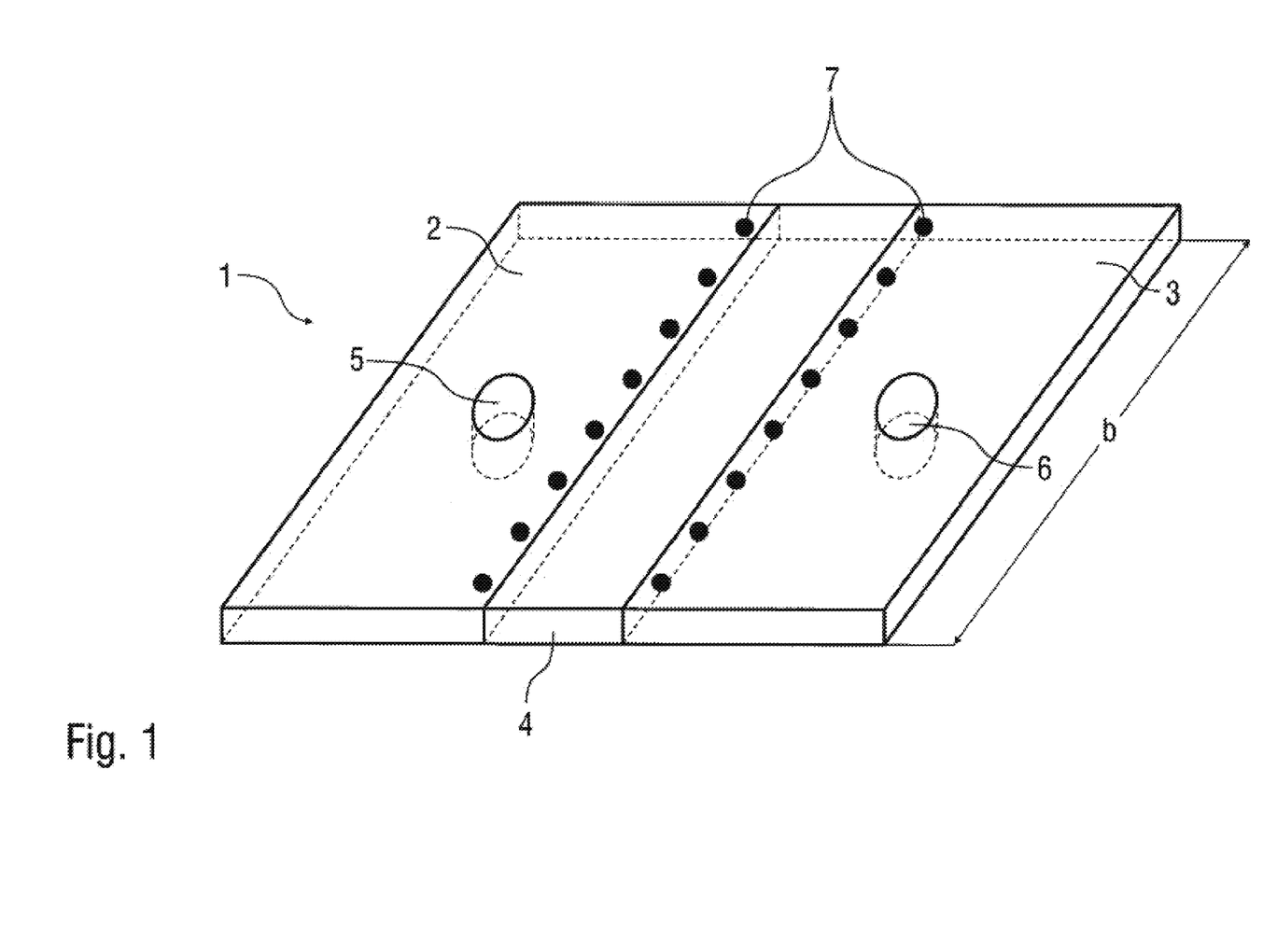
FIG. 1 is a schematic perspective view of a current sense resistor according to the invention having a plurality of voltage-measuring contacts.

FIG. 1 shows a planar current sense resistor 1 for measuring current in accordance with the known four-wire technique. The current sense resistor 1 has a mainly conventional design, so additional reference is made to patent application EP 0 605 800 A1, the content of which can therefore be incorporated in full in the present description.

The current sense resistor 1 essentially comprises two planar connection parts made of a conductive material (e.g. copper or a copper alloy) and a resistor element 4 which is likewise planar and is made of a low-resistance resistive material (e.g. Manganin®). The electric current to be measured is here fed into the connection part 2 then flows through the resistor element 4 and then exits the current sense resistor via the other connection part 3.

For conducting the electric current in and out, the connection parts 2, 3 each have one or more holes 5, 6, to which connecting contacts, for example, can be screw-fastened.

In this exemplary embodiment, the current sense resistor 1 has a width b=200 mm, although other values for the width b of the current sense resistor 1 are also possible.

The problem here is the fact that the current density in the resistor element 4 is not precisely homogeneous nor oriented in exactly the same direction, but varies across the width b of the current sense resistor 1, which in the conventional measuring resistors results in corresponding measurement errors because in these resistors the voltage drop across the resistor element 4 is measured by only two voltage-measuring contacts.

Therefore the current sense resistor 1 according to the invention comprises a plurality of pairs of voltage-measuring contacts 7, which are distributed across the width b of the current sense resistor 1. For each of the pairs of voltage-measuring contacts 7, one of the voltage-measuring contacts 7 is attached to the connection part 2, whereas the other voltage-measuring contact 7 of each pair is connected to the other connection part 3. The individual pairs of voltage-measuring contacts 7 thus each measure the voltage drop across the resistor element 4 at different positions along the width b of the current sense resistor 1.

In one measurement, a plurality of voltage values are then measured simultaneously at the voltage-measuring contacts 7, from which measured values a voltage value can be derived, for instance by weighted averaging, that is free of the error-producing inhomogeneities described above in the current density in the resistor element 4 and is therefore more precise.

Figure 2:
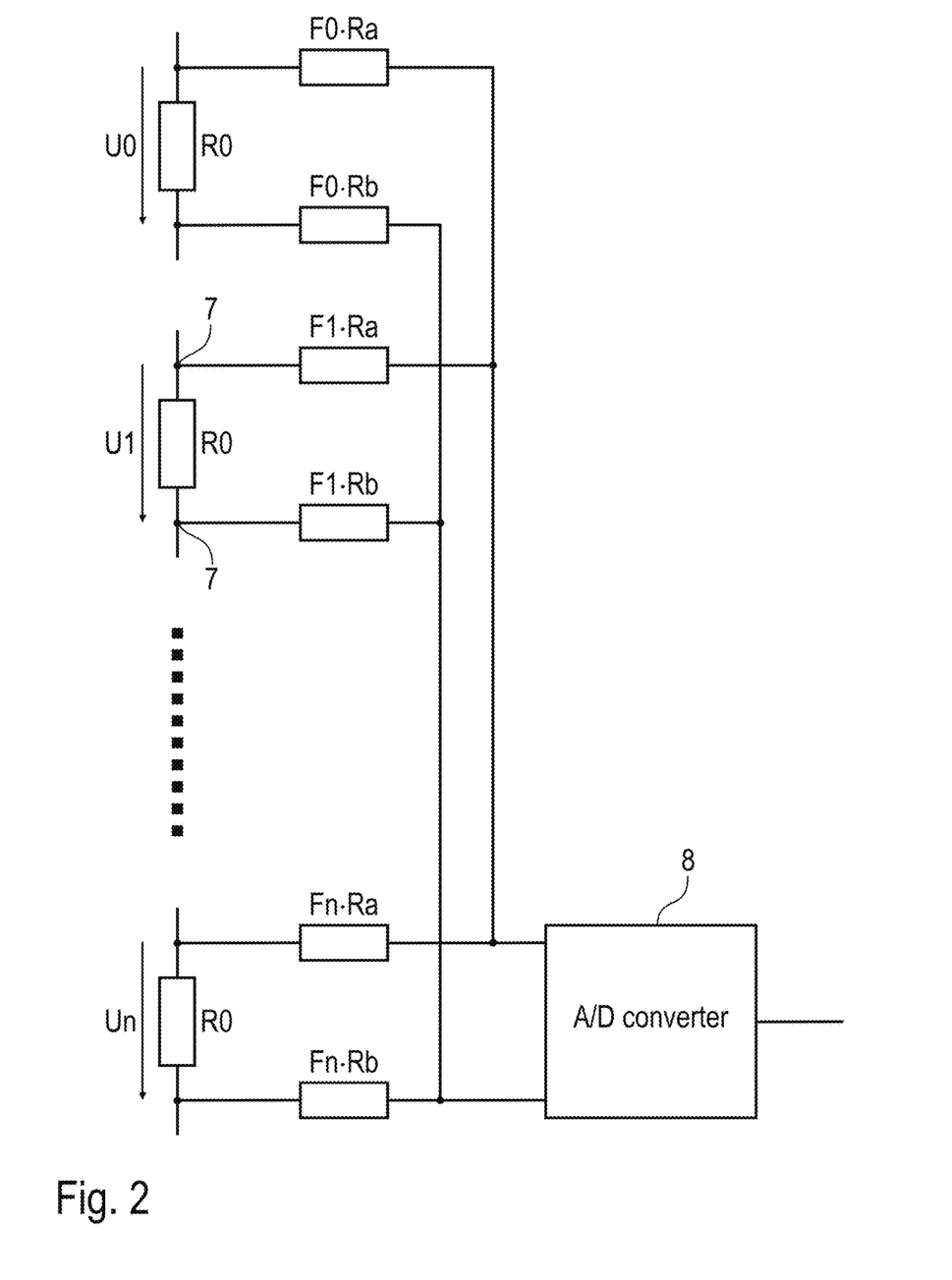
FIG. 2 is a schematic diagram of a circuit for obtaining by analog means the average of the individual voltage values measured at the voltage-measuring contacts of the current sense resistor shown in FIG. 1.

FIG. 2 shows a highly simplified schematic diagram of a circuit to illustrate obtaining by analog means the average of the voltage values measured at the different pairs of voltage-measuring contacts 7 in the current sense resistor 1 shown in FIG. 1.

For this purpose, at the current sense resistor 1, voltage values $U0, U1, \ldots, Un$ are measured at each different pair of voltage-measuring contacts 7, where the measured voltage values $U0, U1, \ldots, Un$ are respectively the voltage drop across a corresponding effective resistance $R0, R1, \ldots, Rn$.

The measured voltage values $U0, U1, \ldots, Un$ are then input via differently weighted resistors $F0 \cdot Ra, F0 \cdot Rb, F1 \cdot Ra, F1 \cdot Rb, \ldots, Fn \cdot Ra, Fn \cdot Rb$ to an analog measuring system or an analog-to-digital converter 8, which then outputs a corresponding output signal which represents the voltage drop across the resistor element 4 and which is almost completely free of the error-producing inhomogeneities described above.

Figure 3:
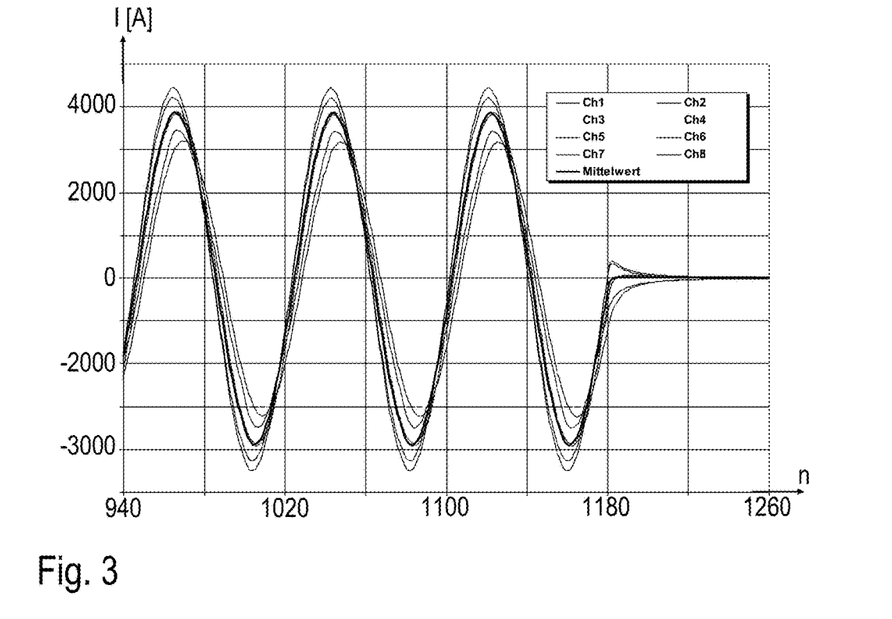
FIG. 3 is a graph illustrating the different current values that result from the different measured voltage values in accordance with Ohm's law.

FIG. 3 shows measurement results on the current sense resistor 1 according to the invention having a resistance value of $R=1\ \mu\Omega$ and a width b=200 mm and eight pairs of voltage-measuring contacts 7. The supplied electric current I equals 4 kA in this case.

It is apparent from the graph that the individual measured voltage values at the different pairs of voltage-measuring contacts 7 differ slightly in terms of both amplitude and phase.

Figure 4:
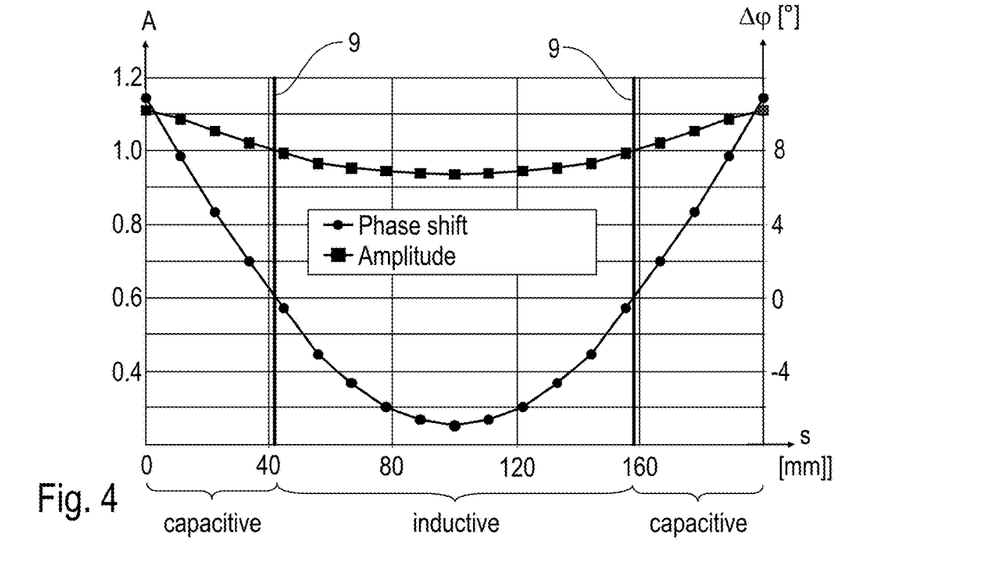
FIG. 4 is a graph illustrating amplitude and phase shift at the various voltage-measuring contacts as a function of the spatial position of the voltage-measuring contacts.

FIG. 4 shows a further graph illustrating the dependency of the amplitude and phase as a function of the measurement position of the voltage-measuring contacts 7 inside the current sense resistor 1.

In this graph, the distance of the particular voltage-measuring contact 7 from the side edge of the current sense resistor 1 is shown along the X-axis.

The Y-axis, however, shows the normalized amplitude of the measured voltage value on one side and the phase shift in degrees on the other side.

It is apparent form the graph that the current and voltage in the center of the current sense resistor 1 exhibit an inductive behavior, whereas the current and voltage in the lateral edge regions of the current sense resistor exhibit a capacitive behavior. Located between the inductive central region of the current sense resistor 1 and the capacitive side regions of the current sense resistor 1 is what is known as a neutral point 9, which is in fact a line along the main direction of current flow in the current sense resistor 1. For an arrangement of a pair of voltage-measuring contacts 7 at the neutral point 9, the measured voltage values and the electric current exhibit neither capacitive nor inductive behavior but are substantially in phase.

Figure 5:
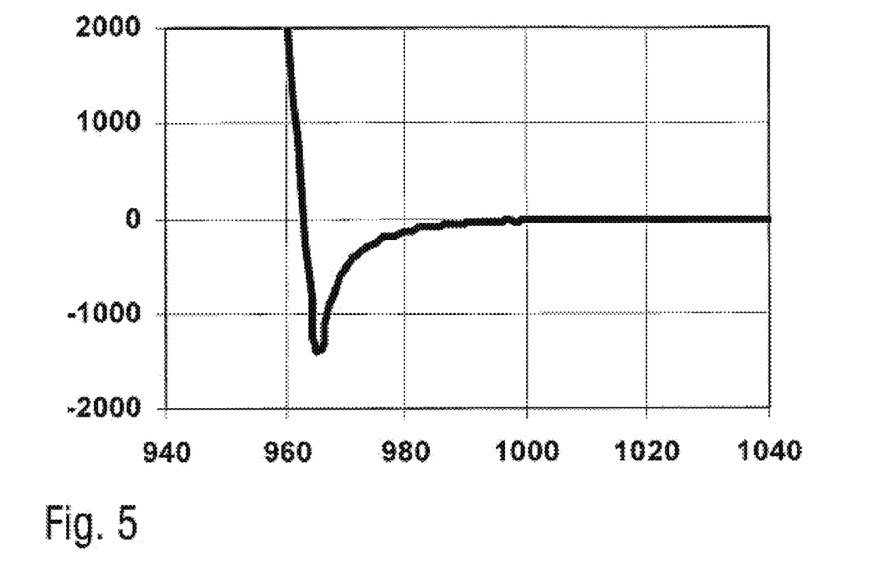
FIG. 5 is a graph illustrating the capacitive behavior of current and voltage in the outer regions of the current sense resistor.

FIG. 5 shows the capacitive behavior of the current and voltage in the lateral outer regions of the current sense resistor 1 during a switch-off operation. It is clear from the graph that an overshoot occurs with a positive phase shift.

Figure 6:
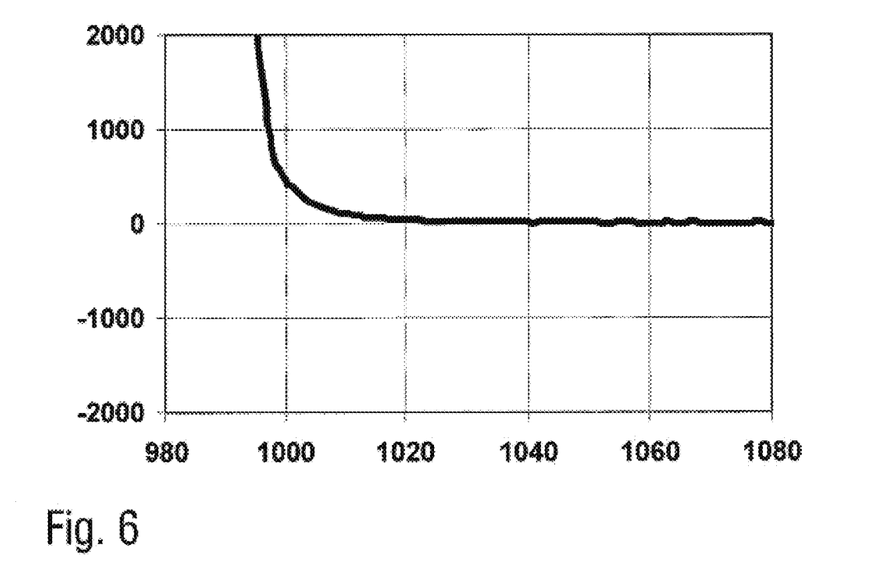
FIG. 6 is a graph illustrating the inductive behavior in the central region of the current sense resistor.

FIG. 6 shows the inductive behavior of the current and voltage in the central region of the current sense resistor 1 during a switch-off operation. The graph shows the asymptotic decay of the measurement signal.

Figure 7:
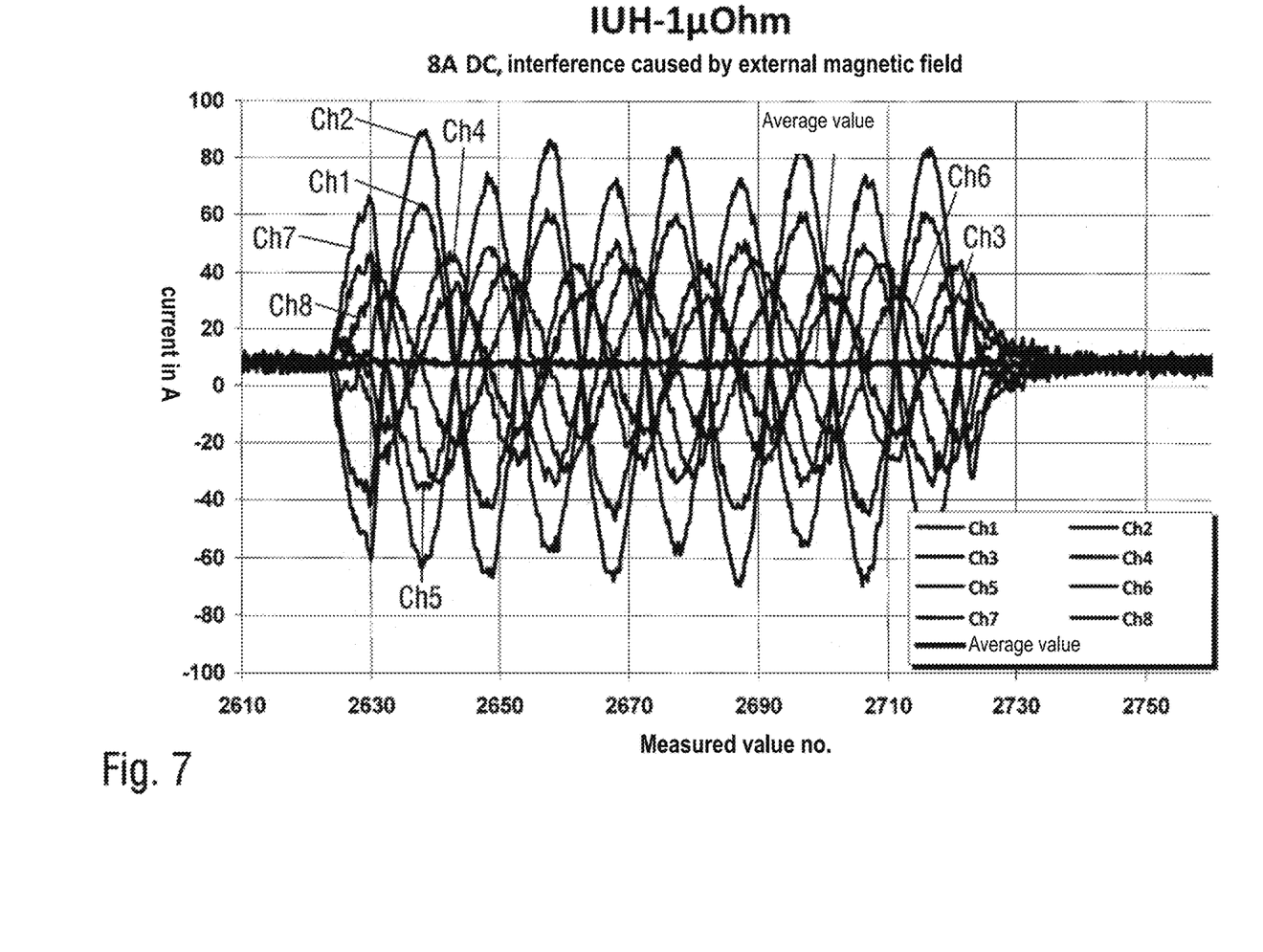
FIG. 7 is a graph illustrating the interference in the measurement caused by an external magnetic field.

In addition, FIG. 7 shows the measured voltage values at the different pairs of voltage-measuring contacts 7, or rather the resultant corresponding current values for a DC current of approximately I=8 A and with an AC cable carrying approximately I=5000 A running immediately beside the current sense resistor 1. The magnetic field occurring in the AC cable causes eddy currents in the connecting leads to the current sense resistor 1 and in the current sense resistor itself, which eddy currents are measured with varying phase and amplitude in the individual channels, i.e. in the individual pairs of voltage-measuring contacts 7, but are not visible in the weighted average. Thus by averaging the different measured voltage values it is advantageously also possible to correct for the interference effects of an external magnetic field.

Figure 8:
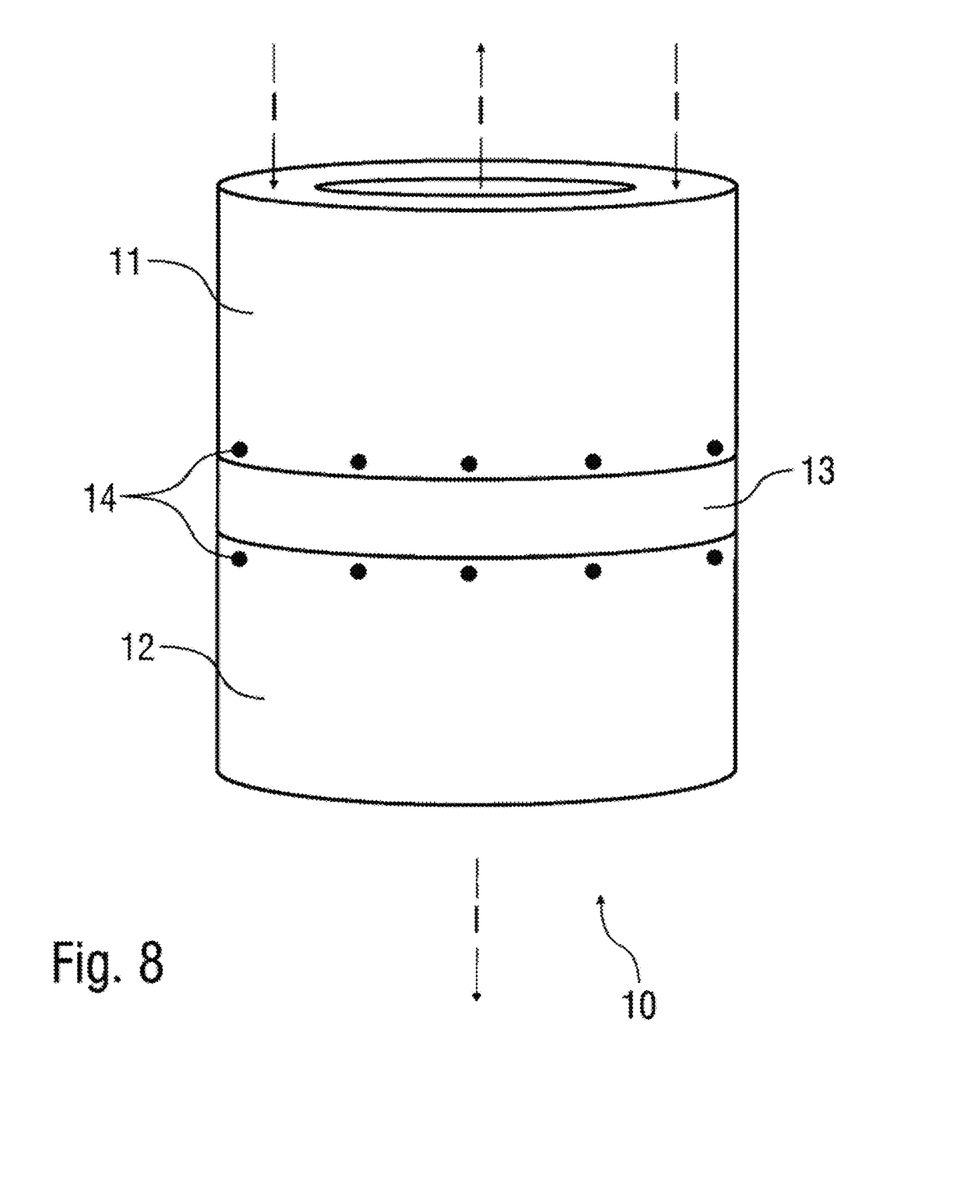
FIG. 8 is a perspective partial view of a coaxial resistor having a plurality of voltage-measuring contacts.

FIG. 8 shows a partial view of a coaxial resistor 10, such as the resistor described in full in WO 2007/068409 A1 for example, which means there is no need to provide a full description of the design and operation of a coaxial resistor 10. Therefore the description of the design and operation of the coaxial resistor 10 given in patent application WO 2007/068409 A1 already cited above is incorporated in full in the present description.

It should merely be mentioned at this point that the coaxial resistor 10 has two annular connection parts 11, 12, between which is inserted a likewise annular resistor element 13.

In addition, the coaxial resistor 10 comprises a plurality of pairs of voltage-measuring contacts 14, which are distributed around the circumference and hence can correct for inhomogeneities in the current distribution around the circumference, as is already obvious per se from the above description.

Figure 9:
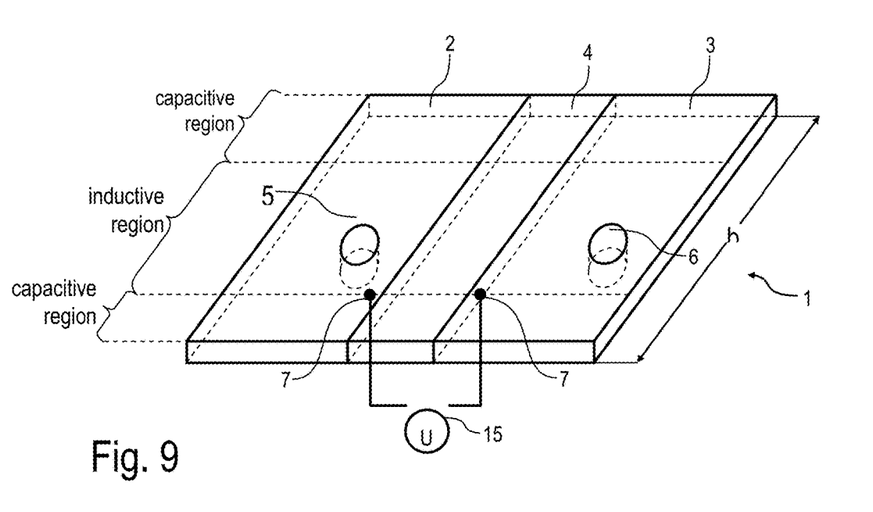
FIG. 9 shows an alternative exemplary embodiment of a planar current sense resistor having just one pair of voltage-measuring contacts.

FIG. 9 shows another variant of a current sense resistor 1 according to the invention, which is substantially identical to the current sense resistor 1 shown in FIG. 1, and therefore to avoid repetition, reference is made to the above description, in which the same reference signs are used for corresponding features.

A special feature of this exemplary embodiment is that the current sense resistor 1 has only a single pair of voltage-measuring contacts 7, which, however, in order to avoid error-producing effects of the inhomogeneities in the current distribution in the resistor element 4, are arranged in the region of the neutral point 9 i.e. exactly at the boundary between the capacitive region and the inductive region of the current sense resistor 1. When an evaluation unit 15 is used to measure a voltage value at the voltage-measuring contacts 7, the current and voltage thus exhibit neither inductive behavior nor capacitive behavior but are substantially in phase.

Figure 10:
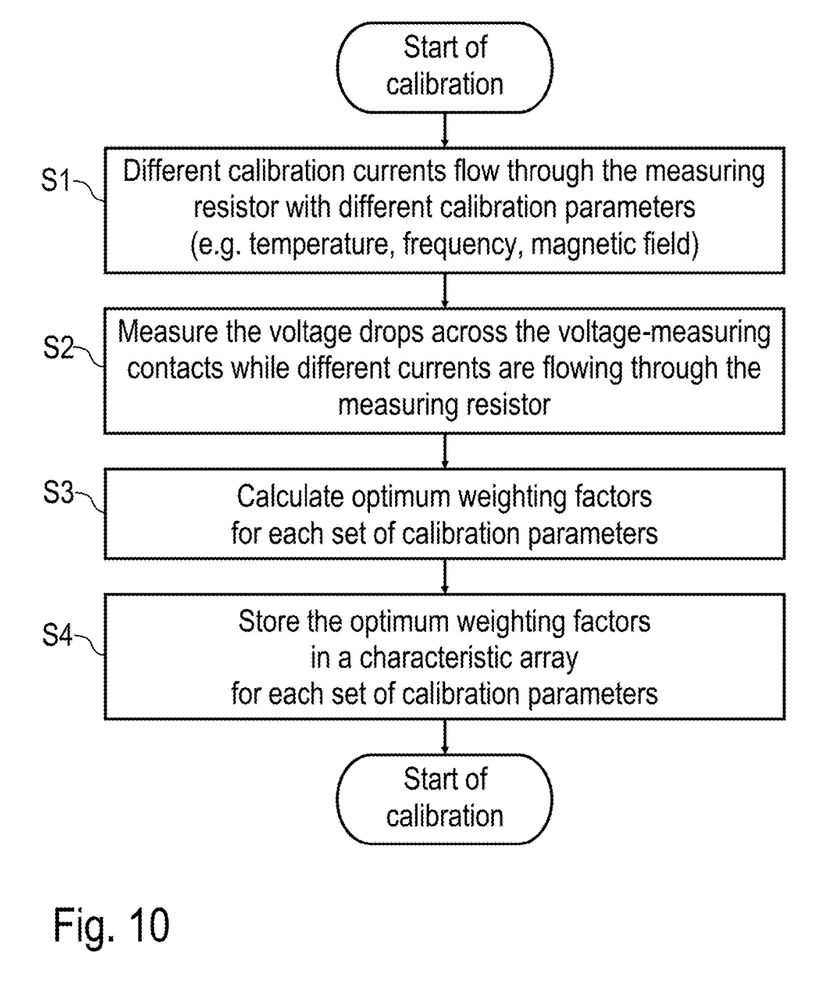
FIG. 10 is a flow diagram illustrating the calibration process for determining the optimum weighting factors for different measurement conditions.

FIG. 10 shows a flow diagram illustrating a calibration process for determining the optimum weighting factors for different measurement conditions.

In a first step S1, different known calibration currents flow through the current sense resistor, with different calibration parameters (e.g. temperature, frequency, magnetic field) prevailing in each case. The currently valid values of the calibration parameters hence each define a particular multidimensional operating point, which operating point has an effect on the error-producing inhomogeneities in the resistor element. Then for each of the different calibration currents flowing through the current sense resistor, the voltage drops across the voltage-measuring contacts are measured.

In a step S3, an optimum set of weighting factors for each particular operating point, i.e. for each set of calibration parameters, is then calculated.

The optimum sets of weighting factor calculated in this way are then stored in a multidimensional characteristic array in a step S4.

Figure 11:
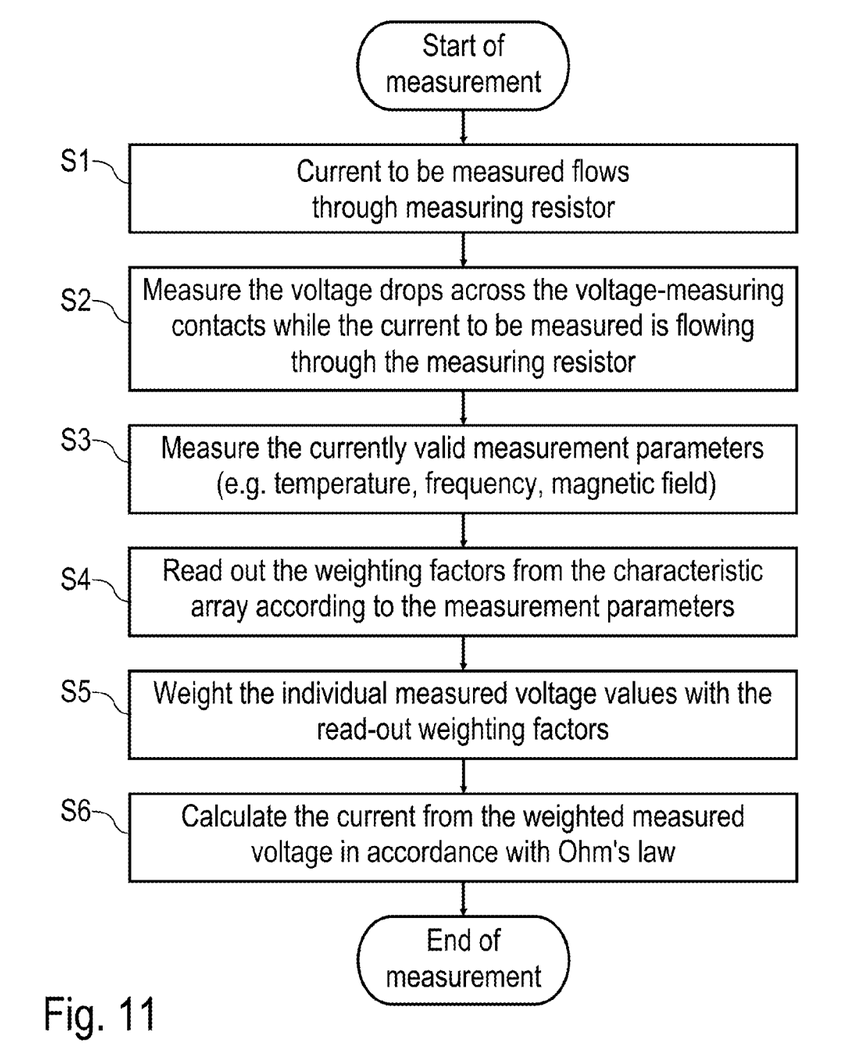
FIG. 11 is a flow diagram illustrating the actual measuring method for different measurement conditions.

FIG. 11 shows a flow diagram illustrating the actual measuring method based on the calibration described above.

In a step S1, a current to be measured flows through the measuring resistor.

In a step S2, the voltage drops across the voltage-measuring contacts are measured while the current to be measured flows through the measuring resistor.

While the current is flowing, the currently prevailing measurement parameters (e.g. temperature, frequency, magnetic field) are also measured, because these measurement parameters may have an effect on the error-producing inhomogeneities in the resistor element of the current sense resistor.

In a step S4, a set of weighting factors to fit the currently prevailing measurement parameters is then read out of the characteristic array, which weighting factors were determined previously in the calibration process shown in FIG. 10.

In a step S5, the measured voltage values are then weighted by the read-out weighting factors in order to determine a measured voltage value.

Then finally in a step S6, the current is calculated from the weighted measured voltage value in accordance with Ohm's law.

The invention is not restricted to the preferred exemplary embodiments described above. In fact numerous variants and variations are possible that likewise make use of the inventive idea and hence are covered by the scope of protection. In particular, the invention also claims protection for the subject matter and the features of the dependent claims regardless of the claims to which each makes reference.

LIST OF REFERENCES 1 current sense resistor
2 connection part
3 connection part
4 resistor element
5 hole
6 hole
7 voltage-measuring contacts
8 analog-to-digital converter
9 neutral point
10 coaxial resistor
11 connection part
12 connection part
13 resistor element
14 voltage-measuring contacts
15 evaluation unit
b width of the current sense resistor

The invention claimed is:
1. A measuring resistor comprising:
a) a first connection part comprising a conductive material for conducting a current into the measuring resistor,
b) a second connection part comprising a conductive material for conducting the current out of the measuring resistor,
c) a resistor element comprising a resistive material, which resistor element is arranged in a direction of current flow between the two connection parts, and through which resistive material the current flows,
d) a first pair of voltage-measuring contacts for measuring a voltage drop across the resistor element, wherein a first voltage-measuring contact of the first pair of voltage-measuring contacts is electrically connected to the first connection part, whereas a second voltage-measuring contact of the first pair of voltage-measuring contacts is electrically connected to the second connection part,
e) at least one second pair of voltage-measuring contacts for measuring the voltage drop across the resistor element, wherein a first voltage-measuring contact of the at least one second pair of voltage-measuring contacts is electrically connected to the first connection part, whereas a second voltage-measuring contact of the at least one second pair of voltage-measuring contacts is electrically connected to the second connection part,
f) an evaluation unit, which is connected to the pairs of voltage-measuring contacts and acquires the measured voltage values,
g) wherein the evaluation unit is configured to determine from the measured voltage values the voltage drop across the resistor element,
h) the evaluation unit is configured to weigh each of the individual measured voltage values with a weighting factor, and
i) the evaluation unit is configured to determine the voltage drop across the resistor element from the weighted measured voltage values.

2. The measuring resistor as claimed in claim 1, wherein the pairs of voltage-measuring contacts are arranged in the measuring resistor side-by-side with respect to the direction of current flow.

3. The measuring resistor as claimed in claim 1, wherein the pairs of voltage-measuring contacts are arranged in a substantially equidistant distribution.

4. The measuring resistor as claimed in claim 1, wherein the resistor element has a width across the direction of current flow of at least 5 mm.

5. The measuring resistor as claimed in claim 1, wherein a number of pairs of voltage-measuring contacts is greater than four.

6. The measuring resistor as claimed in claim 1, wherein the measuring resistor is planar.

7. The measuring resistor as claimed in claim 1, wherein the measuring resistor is a coaxial resistor, wherein the pairs of voltage-measuring contacts are distributed around a circumference.

8. The measuring resistor as claimed in claim 1, wherein
a) the measuring resistor exhibits a capacitive behavior at least at one of the pairs of voltage-measuring contacts, and
b) the measuring resistor exhibits an inductive behavior at least at one of the pairs of voltage-measuring contacts.

9. A measurement assembly comprising a measuring resistor as claimed in claim 1 and comprising an evaluation unit, which is connected to the pairs of voltage-measuring contacts and acquires measured voltage values, and determines from the measured voltage values the voltage drop across the resistor element.

10. A measuring resistor comprising:
a) a first connection part comprising a conductive material for conducting a current into the measuring resistor,
b) a second connection part comprising a conductive material for conducting the current out of the measuring resistor,
c) a resistor element comprising a resistive material, which resistor element is arranged in a current direction between the two connection parts, and through which resistive material the current flows, and comprising
d) a first pair of voltage-measuring contacts for measuring a voltage drop across the resistor element, wherein a first voltage-measuring contact of the first pair of voltage-measuring contacts is electrically connected to the first connection part, whereas a second voltage-measuring contact of the first pair of voltage-measuring contacts is electrically connected to the second connection part,
e) wherein the first pair of voltage-measuring contacts is arranged at a position at which the measuring resistor exhibits neither capacitive nor inductive behavior, and the current flowing through the measuring resistor and the voltage across the voltage-measuring contacts of the first pair are substantially in phase.

11. A measurement assembly comprising a measuring resistor as claimed in claim 10 and comprising an evaluation unit, which is connected to the at least one pair of voltage-measuring contacts and acquires the measured voltage values, and determines from the measured voltage values the voltage drop across the resistor element.

12. A measuring method comprising the following steps:
a) conducting a current to be measured into a measuring resistor, so that the current flows through a resistor element in the measuring resistor,
b) conducting the current out of the measuring resistor, and
c) determining a voltage drop across the resistor element of the measuring resistor when the current is flowing through the resistor element, which voltage is measured at a first pair of voltage-measuring contacts,
d) wherein measured voltage values of the voltage drop across the resistor element are measured at each of a plurality of pairs of voltage-measuring contacts, wherein the voltage drop across the resistor element is determined from individual measured voltage values at the pairs of voltage-measuring contacts,
e) weighting each of the individual measured voltage values with a weighting factor, and
f) determining the voltage drop across the resistor element from the weighted measured voltage values.

13. The measuring method according to claim 12, further comprising the following step:
calibrating the weighting factors in a calibration process.

14. The measuring method as claimed in claim 13, further comprising the following steps:
a) determining at least one measurement parameter that has an effect on inhomogeneities in the current in the resistor element, and
b) determining the weighting factors according to the at least one measurement parameter.

15. The measuring method as claimed in claim 14, wherein the measurement parameter comprises at least one of the following variables:
a) frequency of the current,
b) ambient temperature or temperature of the measuring resistor,
c) magnitude and direction of an external magnetic field in which the measurement is taking place,
d) current through the measuring resistor, and
e) voltage across the voltage-measuring contacts.

16. The measuring method as claimed in claim 12, wherein the measured voltage values are measured synchronously at the individual pairs of voltage-measuring contacts.

17. The measuring method as claimed in claim 12, wherein measured voltage values are measured at the individual pairs of voltage-measuring contacts at a sampling rate of at least 100 Hz.

18. The measuring method as claimed in claim 12, further comprising the following steps:
a) calculating a simple or weighted average of the measured voltage values, and
b) calculating the voltage drop across the resistor element from the average of the measured voltage values.

19. The measuring method as claimed in claim 12, wherein
a) analog measured voltage values are converted into digitized measured voltage values, and
b) simple or weighted averaging is performed on the basis of the analog measured voltage values or on the basis of the digitized measured voltage values.

20. A measuring method comprising the following steps:
a) conducting a current to be measured into a measuring resistor, so that the current flows through a resistor element in the measuring resistor,
b) conducting the current out of the measuring resistor, and
c) determining a voltage drop across the resistor element of the measuring resistor when the current is flowing through the resistor element, which voltage is measured at a first pair of voltage-measuring contacts,
d) wherein the first pair of voltage-measuring contacts is arranged at a position at which the measuring resistor exhibits neither capacitive nor inductive behavior, and the current flowing through the measuring resistor and the voltage across the voltage-measuring contacts of the first pair are substantially in phase.

* * * * *